United States Patent
Lai et al.

(10) Patent No.: US 10,411,159 B2
(45) Date of Patent: Sep. 10, 2019

(54) PATTERNED SUBSTRATE AND LIGHT EMITTING DIODE WAFER

(71) Applicant: PlayNitride Inc., Tainan (TW)

(72) Inventors: Yen-Lin Lai, Tainan (TW); Shen-Jie Wang, Tainan (TW); Jyun-De Wu, Tainan (TW); Chien-Chih Yen, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 15/936,460

(22) Filed: Mar. 27, 2018

(65) Prior Publication Data

US 2018/0277718 A1  Sep. 27, 2018

(30) Foreign Application Priority Data

Mar. 27, 2017  (TW) .............................. 106110087 A

(51) Int. Cl.
| H01L 33/00 | (2010.01) |
| H01L 33/20 | (2010.01) |
| H01L 33/12 | (2010.01) |
| H01L 21/78 | (2006.01) |
| H01L 23/00 | (2006.01) |
| H01L 23/544 | (2006.01) |

(52) U.S. Cl.
CPC .............. *H01L 33/20* (2013.01); *H01L 21/78* (2013.01); *H01L 33/0075* (2013.01); *H01L 33/12* (2013.01); *H01L 23/544* (2013.01); *H01L 23/562* (2013.01)

(58) Field of Classification Search
CPC ...... H01L 21/78; H01L 23/544; H01L 23/562
See application file for complete search history.

(56) References Cited

U.S. PATENT DOCUMENTS

| 7,649,256 B2 * | 1/2010 | Kujirai ................... H01L 21/304 257/730 |
| 7,871,902 B2 * | 1/2011 | Kaltalioglu ............. H01L 21/78 257/508 |
| 8,130,253 B2 * | 3/2012 | Ohkawa ...................... B41J 2/45 347/238 |
| 8,610,238 B2 * | 12/2013 | Kaltalioglu ............. H01L 21/78 257/283 |
| 9,196,688 B2 * | 11/2015 | Briere ................. H01L 29/2003 |
| 9,466,675 B2 * | 10/2016 | Miyazaki ............... H01L 23/544 |
| 9,735,056 B2 * | 8/2017 | Takahashi ............... H01L 21/78 |

(Continued)

FOREIGN PATENT DOCUMENTS

| CN | 103066177 | 4/2013 |
| JP | 2001176823 | 6/2001 |

(Continued)

OTHER PUBLICATIONS

"Office Action of Taiwan Counterpart Application," dated Oct. 31, 2018, p. 1-p. 7.

*Primary Examiner* — Nicholas J Tobergte
(74) *Attorney, Agent, or Firm* — JCIPRNET

(57) ABSTRACT

A patterned substrate includes a main base and a plurality of patterned structures. The main base has at least one device-disposed region and a cutting region surrounding the device-disposed region. The patterned structures are integratedly formed with the main base, and only distributed in the cutting region of the main base. The patterned structures are separated from each other.

16 Claims, 7 Drawing Sheets

(56) References Cited

U.S. PATENT DOCUMENTS

| | | | | |
|---|---|---|---|---|
| 2006/0006528 A1* | 1/2006 | Kujirai | ............... | H01L 21/304 |
| | | | | 257/730 |
| 2009/0322852 A1* | 12/2009 | Ohkawa | ............... | B41J 2/45 |
| | | | | 347/256 |
| 2010/0200960 A1* | 8/2010 | Angyal | ............... | H01L 23/585 |
| | | | | 257/620 |
| 2011/0065254 A1* | 3/2011 | Yoneda | ............... | B82Y 10/00 |
| | | | | 438/401 |
| 2011/0297969 A1* | 12/2011 | Kojima | ............... | H01L 33/46 |
| | | | | 257/88 |
| 2015/0214125 A1* | 7/2015 | Tang | ............... | H01L 22/34 |
| | | | | 257/48 |

FOREIGN PATENT DOCUMENTS

| | | |
|---|---|---|
| JP | 2014090011 | 5/2014 |
| JP | 2016164942 | 9/2016 |
| TW | 201228024 | 7/2012 |
| TW | 201237928 | 9/2012 |
| TW | 201310720 | 3/2013 |
| TW | 201434176 | 9/2014 |
| TW | 201624764 | 7/2016 |

* cited by examiner

PATTERNED SUBSTRATE AND LIGHT EMITTING DIODE WAFER

CROSS-REFERENCE TO RELATED APPLICATION

This application claims the priority benefit of Taiwan application serial no. 106110087, filed on Mar. 27, 2017. The entirety of the above-mentioned patent application is hereby incorporated by reference herein and made a part of this specification.

BACKGROUND OF THE INVENTION

1. Field of the Invention

The invention relates to a patterned substrate and a light emitting diode wafer, and more particularly, relates to a patterned substrate and a light emitting diode wafer capable of improving epitaxial quality.

2. Description of Related Art

In the manufacturing process for making the light emitting diode, it is required to grow a material (e.g., a GaN epitaxial structure) on another one material (e.g., a sapphire substrate). At the same time, an interatomic lattice match between the two different materials must be taken into consideration. If the crystal lattice difference between the two materials is overly large, a stress will inevitably be generated at an interface between the two materials. Such interface is where defect and dislocation are found, furthermore, threading dislocation will extend form the interface in epitaxial process to result in poor epitaxial quality which affects device performance.

SUMMARY OF THE INVENTION

The invention provides a patterned substrate capable of improving epitaxial quality.

The invention also provides a light emitting diode wafer, which is capable of solving the issue of epitaxial quality reduced by threading dislocation generated in an epitaxial process due to lattice mismatching in conventional art.

The patterned substrate of the invention includes a main base and a plurality of patterned structures. The main base has at least one device-disposed region and a cutting region surrounding the device-disposed region. The patterned structures are integratedly formed with the main base, and only distributed in the cutting region of the main base, wherein the patterned structures are separated from each other.

In an embodiment of the invention, a surface roughness of the cutting region is greater than a surface roughness of the device-disposed region.

In an embodiment of the invention, the patterned structures protrude from the main base, and a shape of the patterned structures comprises a pyramid, a cone, a ball or a trapezoid.

In an embodiment of the invention, the patterned structures are embedded in the main base, and a shape of the patterned structures comprises a concave-pyramid, a concave-cone, a concave-ball or a concave-trapezoid.

In an embodiment of the invention, a width of the device-disposed region is between 1 μm and 15 μm.

In an embodiment of the invention, the width of the device-disposed region is defined as a distance between two patterned structures respectively located at opposite sides of the device-disposed region and adjacent to the device-disposed region.

In an embodiment of the invention, a ratio of a width to a height of each of the patterned structures is between 0.8 and 1.5.

In an embodiment of the invention, each of the patterned structures has a roughen surface.

The light emitting diode wafer of the invention includes a patterned substrate and an epitaxial layer disposed on the patterned substrate. The patterned substrate includes a main base and a plurality of patterned structures. The base material has at least one device-disposed region and a cutting region surrounding the device-disposed region. The patterned structures are integratedly formed with the main base, and only distribute in the cutting region of the main base. The patterned structures are separated from each other. The patterned structures are located between the main base and the epitaxial layer.

In an embodiment of the invention, a surface roughness of the cutting region is greater than a surface roughness of the device-disposed region.

In an embodiment of the invention, the patterned structures protrude from the main base, and a shape of the patterned structures includes a pyramid, a cone, a ball or a trapezoid.

In an embodiment of the invention, the patterned structures are embedded in the main base, and a shape of the patterned structures includes a concave-pyramid, a concave-cone, a concave-ball or a concave-trapezoid.

In an embodiment of the invention, a width of the device-disposed regions is between 1 μm and 15 μm, and the width of the device-disposed region is defined as a distance between the patterned structures respectively located at two sides of the device-disposed region and adjacent to the device-disposed region.

In an embodiment of the invention, a ratio of a width to a height of each of the patterned structures is between 0.8 and 1.5.

In an embodiment of the invention, each of the patterned structures has a roughen surface.

In an embodiment of the invention, the epitaxial layer has a plurality of sub-epitaxial structures, and the sub-epitaxial structures are separated from each other and correspondingly located on the device-disposed regions.

In an embodiment of the invention, a ratio of a width to a height of each of the patterned structures is between 0.2 and 1.

In an embodiment of the invention, the light emitting diode wafer further includes a buffer layer, which is located between the patterned substrate and the epitaxial layer. The buffer layer has a plurality of buffer portions separated from each other, each of the buffer portions is correspondingly located on one of the device-disposed regions, and the sub-epitaxial structures are respectively formed on the buffer portions.

In an embodiment of the invention, each of the buffer portions has a bottom surface in contact with the main base and a top surface in contact with each of the sub-epitaxial structures, and an area of the bottom surface is less than an area of the top surface.

Based on the above, the patterned structures are integratedly formed with the main base, and the patterned structures are separated from each other and only distributed in the cutting region of the main base. In the later epitaxial process performed on the patterned substrate, the patterned structures located in the cutting region can effectively reduce stress between main base and epitaxial structure layer (e.g. compressive stress), and threading dislocation in the epitaxial layer will decrease and the epitaxial layer quality (especially the part of the epitaxial layer on the device-disposed region) will improve.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
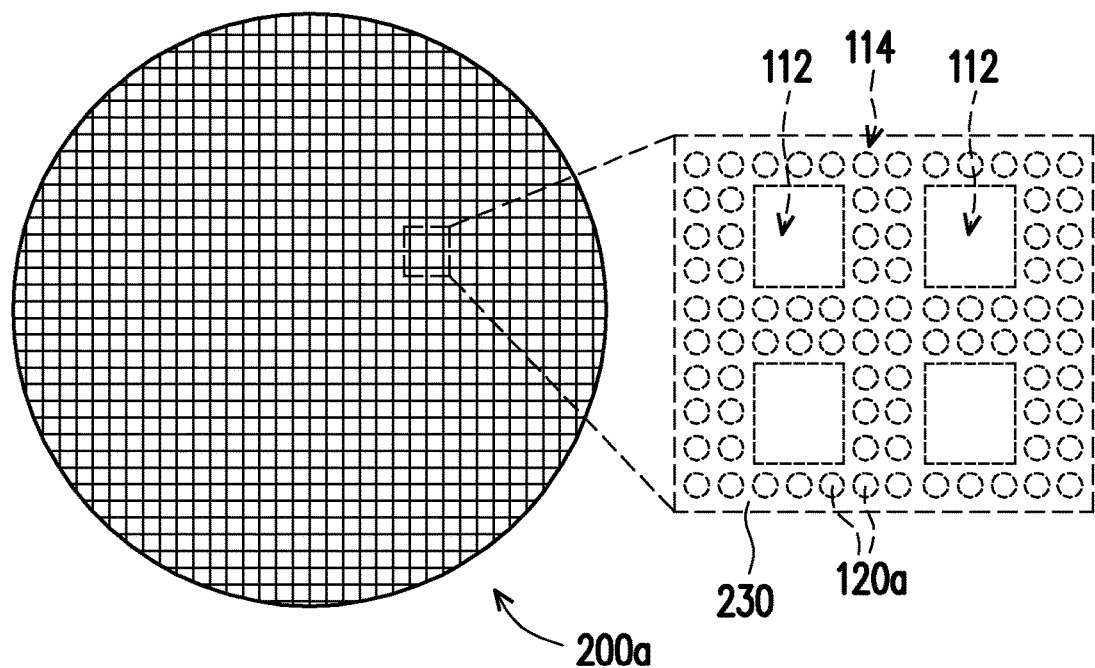
FIG. 1A illustrates a top view of a light emitting diode wafer according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
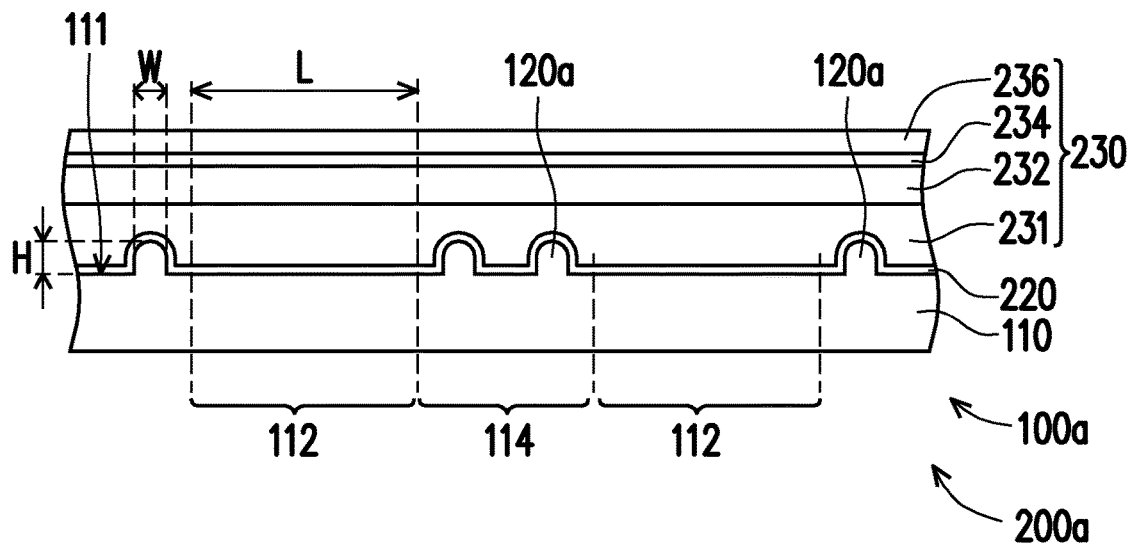
FIG. 1B illustrates a partial cross-sectional view of the light emitting diode wafer depicted in FIG. 1A.

FIG. 1A illustrates a top view of a light emitting diode wafer according to an embodiment of the invention. FIG. 1B illustrates a partial cross-sectional view of the light emitting diode wafer depicted in FIG. 1A. Referring to FIG. 1A and FIG. 1B together, a light emitting diode wafer 200a of the present embodiment includes a patterned substrate 100a, a buffer layer 220 and an epitaxial layer 230. The patterned substrate 100a of the present embodiment includes a main base 110 and a plurality of patterned structures 120a. The main base 110 has at least one device-disposed region 112 (a plurality of which is schematically illustrated in FIG. 1A and FIG. 1B) and a cutting region 114 surrounding the device-disposed region 112. The patterned structures 120a are integratedly formed with the main base 110, and located in the cutting region 114 of the base material 110. The patterned structures 120a are separated from each other and only distributed in the cutting region 114.

In detail, the patterned substrate 100a of the present embodiment is, for example, a sapphire wafer, and the patterned structures 120a can be formed by directly patterning the sapphire wafer. In this way, the patterned structures 120a of the present embodiment and the main base 110 have the same material (i.e., sapphire) and are integratedly formed. As shown in FIG. 1B, the patterned structures 120a of the present embodiment are disposed on and protrude from the main base 110 (e.g., on an upper surface 111 of the main base 110) and located only in the cutting region 114. That is to say, the patterned structures 120a are not disposed in the device-disposed region 112 of the main base 110. Therefore, after going through the subsequent processes for cutting substrate or etching for LED chips manufacturing, the patterned structures 120a will no longer exist in the subsequent product (e.g., LED chips). Herein, a shape of the patterned structures 120a is, for example, a cylinder, but the invention is not limited thereto.

Furthermore, the epitaxial layer 230 of the present embodiment covers the device-disposed region 112 and the cutting region 114 of the patterned substrate 100a and the patterned structures 120a, and is located on the buffer layer 220. Herein, the epitaxial layer 230 includes a non-doped semiconductor layer 231, a first-type semiconductor layer 232, an active layer 234 and a second-type semiconductor layer 236, wherein the non-doped semiconductor layer 231, the first-type semiconductor layer 232, the active layer 234 and the second-type semiconductor layer 236 are stacked in sequence. In the present embodiment, the first-type semiconductor layer 232 is, for example, an n-type semiconductor layer; the second-type semiconductor layer 236 is, for example, a p-type semiconductor layer; the buffer layer 220 is formed by using materials suitable for lattice matching or epitaxial growth (e.g., AlN, GaN) in film formation; but the invention is not limited to the above.

In other non-illustrated embodiments, the patterned substrate is, for example, a Si substrate, a SiC substrate or a glass substrate, and the patterned structures distributed only in the cutting region can be formed by directly patterning aforementioned substrates. More specifically, a different material is also selected for the buffer layer according to the main base material and the epitaxial layer material, and in other embodiment, the buffer layer is not required. In other words, the buffer layer 220 is a selective film layer.

In addition, a ratio of a width W to a height H of each of the patterned structures 120a is between 0.8 and 1.5 in the present embodiment. More preferably, the width W of each of the patterned structures 120a is, for example, between 0.5 μm and 3 μm, and the height H of each of the patterned structures 120a is, for example, between 0.4 μm and 3 μm. Furthermore, a width L of the device-disposed region 122 is, preferably, between 1 μm and 15 μm. More specifically, the width L of the device-disposed region 112 is defined as: a distance between two of the patterned structures 120a respectively located at two opposite sides of the device-disposed region 112 and adjacent to the device-disposed region 112.

It is noted that, if a dimension of the patterned structures 120a is too large (e.g., greater than the range defined above), it is more difficult to separate the epitaxial layer 230 from the patterned substrate 100a. Furthermore, the epitaxial layer 230 have to grow thicker cause of the bigger patterned structures 120a and LED chips formed from this light emitting diode wafer with thicker epitaxial layer 230 cannot achieve weightless and thin structure. By contrast, if the dimension of the patterned structures 120a is too small (e.g., less than the range defined above), the capability of the patterned structures 120a for controlling compression stress and threading dislocation in the epitaxial layer 230 to centered on the cutting region 114 is reduced such that epitaxial quality on the device-disposed region 112 cannot be effectively improved.

In brief, in the design of the patterned substrate 100a according to the present embodiment, the patterned structures 120a are integratedly formed with the main base 110, and the patterned structures 120a are separated from each other and only distributed in the cutting region 114 of the main base 110. In the later epitaxial process to form the epitaxial layer 230 on the patterned substrate 100a, the patterned structures 120a located in the cutting region 114 can effectively reduce compressive stress and threading dislocation in the epitaxial layer 230, especially the part of epitaxial layer 230 on the device-disposed region 112 so as to improve epitaxial quality of LED chips manufacturing by later process from the light emitting diode wafer 200a of the present embodiment.

Figure 2:
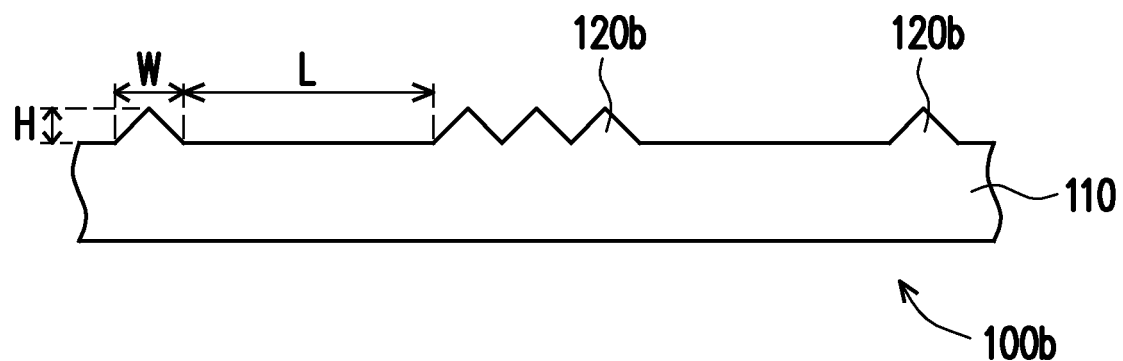
FIG. 2 illustrates a partial cross-sectional view of a light emitting diode wafer according to another embodiment of the invention.
Figure 3:
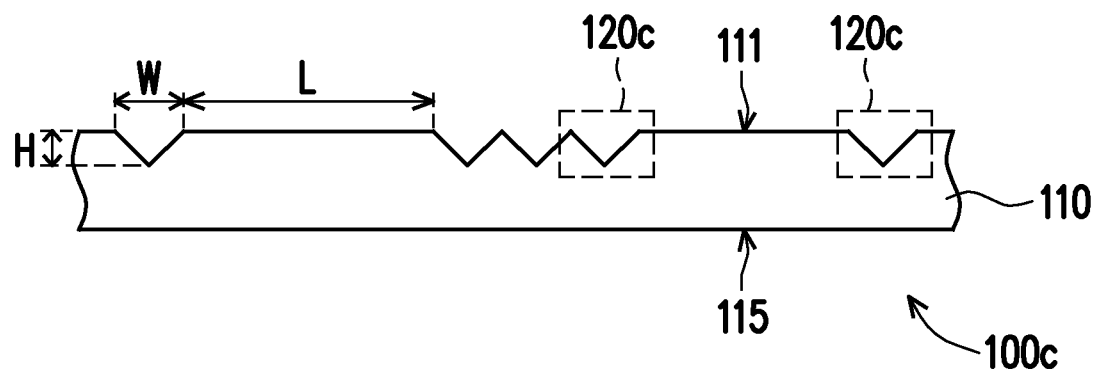
FIG. 3 illustrates a partial cross-sectional view of a light emitting diode wafer according to another embodiment of the invention.

It is noted that, the invention is not intended to limit a structure type of the patterned structure. Refer to FIG. 2, in a patterned substrate 100b according to another embodiment, a shape of patterned structures 120b may be, for example, a pyramid or a cone protruded from the main base 110. Alternatively, with reference to FIG. 3, in a patterned substrate 100c according to yet another embodiment, patterned structures 120c may also be embedded in the base material 110, and a shape of the patterned structures 120c is, for example, a concave-pyramid. The patterned structure 125c extend from the upper surface 111 toward the bottom surface 115. Alternatively, in other non-illustrated embodiments, the patterned structures may be disposed on the main base and have a shape of a ball, a trapezoid or other suitable shapes; or, the patterned structures may be embedded in the substrate and have a shape of a concave-pyramid, a concave-cone, a concave-ball or other suitable shapes, which are not particularly limited by the invention.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 4:
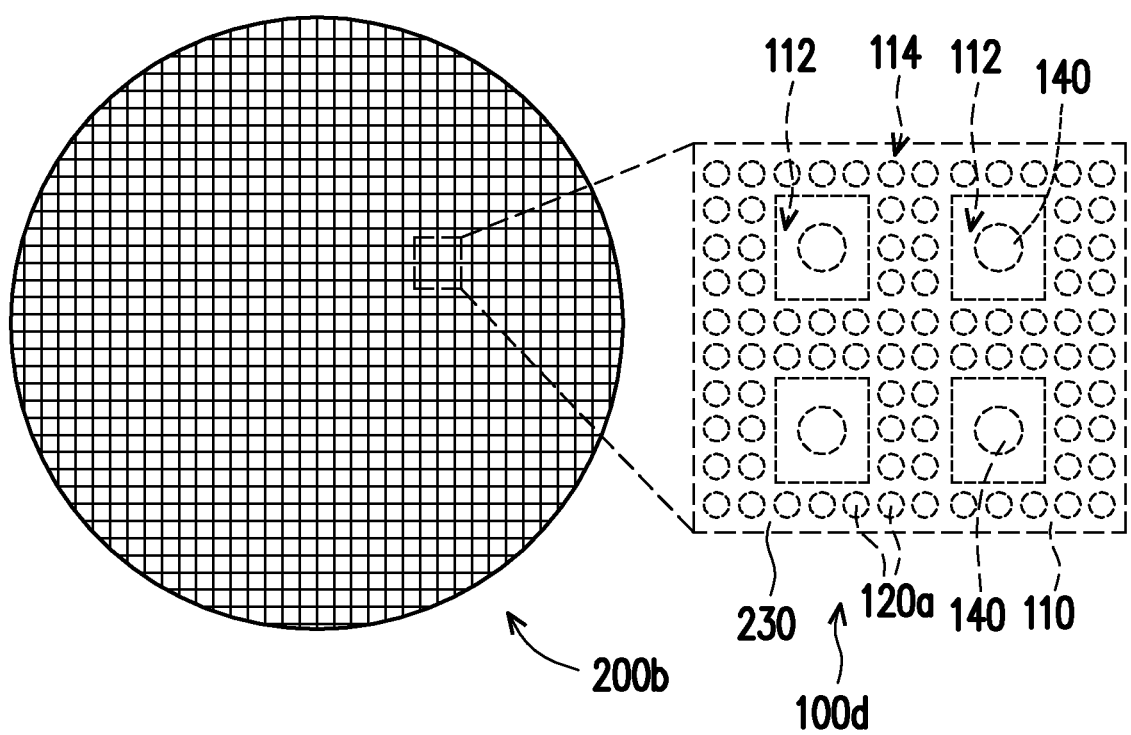
FIG. 4 illustrates a top view of a light emitting diode wafer according to an embodiment of the invention.

FIG. 4 illustrates a top view of a light emitting diode wafer according to another embodiment of the invention. With reference to FIG. 4, a light emitting diode wafer 200b of the present embodiment is similar to the light emitting diode wafer 200a of FIG. 1A, and the difference between the two embodiments includes the following. A patterned substrate 100d of the light emitting diode wafer 200b of the present embodiment further includes a plurality of auxiliary patterned structures 140, which are integratedly formed with main base 110 and respectively only located in the device-disposed region 112 of the main base 110, wherein the auxiliary patterned structures 140 are separated from each other. A projected area of the auxiliary patterned structures 140 on the base material 110 is greater than that of the patterned structures 120a in the cutting region 114. Moreover, the auxiliary patterned structures 140 are protruded from the upper surface of the main base 110 or embedded in the main base 110, and a height (or depth) of the auxiliary patterned structures 140 is less than the height (or depth) of the patterned structures 120a. Herein, the auxiliary patterned structures 140 can effectively drive compressive stress and threading dislocation in the epitaxial structure layer 230 away from the part of the epitaxial layer 230 on device-disposed region 112 so as to improve epitaxial quality.

Figure 5A:
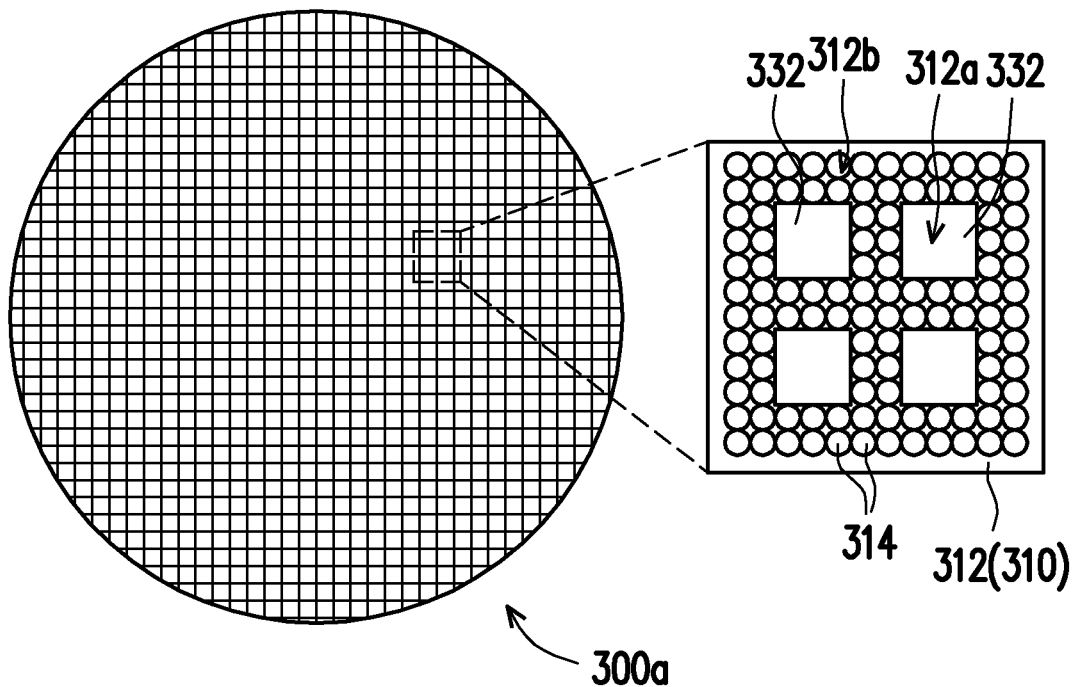
FIG. 5A illustrates a top view of a light emitting diode wafer according to another embodiment of the invention.
Figure 5B:
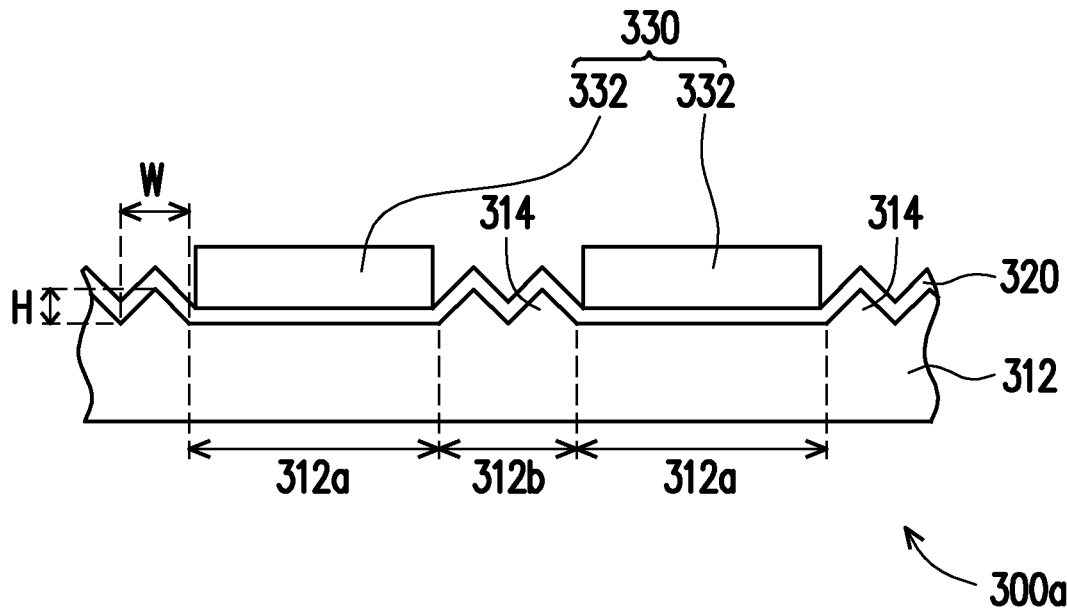
FIG. 5B illustrates a partial cross-sectional view of the light emitting diode wafer depicted in FIG. 5A.

FIG. 5A illustrates a top view of a light emitting diode wafer according to another embodiment of the invention, and FIG. 5B illustrates a partial cross-sectional view of the light emitting diode wafer depicted in FIG. 5A. Referring to FIG. 5A and FIG. 5B, a light emitting diode wafer 300a of the present embodiment includes a patterned substrate 310, a buffer layer 320 and an epitaxial layer 330. The patterned substrate 310 includes a main base 312 and a plurality of patterned structures 314. The main base 312 has a plurality of device-disposed regions 312a and a cutting region 312b surrounding the device-disposed regions 312a. The patterned structures 314 are integratedly formed with the main base 312, the patterned structures 314 are only located in the cutting region 312b of the main base 312, and an aspect ratio (W/H) of the patterned structures 314 is between 0.2 and 1. Moreover, the thickness of the epitaxial layer 330 is 3~7 um, the ratio between the thickness of the epitaxial layer 330 and the height of the patterned structure 314 is 1~10.

The buffer layer 320 is formed on the patterned substrate 310, and the epitaxial layer 330 is formed on the buffer layer 320 and has a plurality of independently-separated sub-epitaxial structures 332, and each of the sub-epitaxial structures 332 is correspondingly formed on the device-disposed region 312a. The aspect ratio of the patterned structure 314 is a major factor for forming the separated sub-epitaxial structures 332 without etching process in the present embodiment. If the aspect ratio is overly large (i.e. the height of the patterned structure 314 too small), the epitaxial layer 330 will form on the cutting region and cannot be form sub-epitaxial structures 332 effectively separated from each other in the epitaxial process; conversely, if the aspect ratio is overly small (i.e., if the height (or depth) of the patterned structures 314 is larger), epitaxial quality maybe get worse because the atom deposition become difficult or the surface of the device-disposed regions 312a may be have more defect position due to longer etching time to form the patterned structures 314.

Because the patterned structures 314 of the present embodiment are densely formed in the cutting region 312b and the aspect ratio of the patterned structures 314 greater than 0.2, the buffer layer 320 has different thickness or even a non-continuous film layer on the cutting region 312b and the device-disposed region 312a, so the epitaxial layer 330 cannot be grown in the cutting region 312b. Accordingly, independently-separated sub-epitaxial structures 332 can be directly formed in the epitaxial process without additional pattern process. In other words, when the light emitting diode wafer 300a is be cut into a plurality of light emitting diode chips, it is only required to cut the patterned substrate 310. In this way, the side surface of the sub-epitaxial structure 332 can be saved from damages during the manufacturing process so the side surface can be prevented from defect that affects light emitting efficiency.

Figure 6:
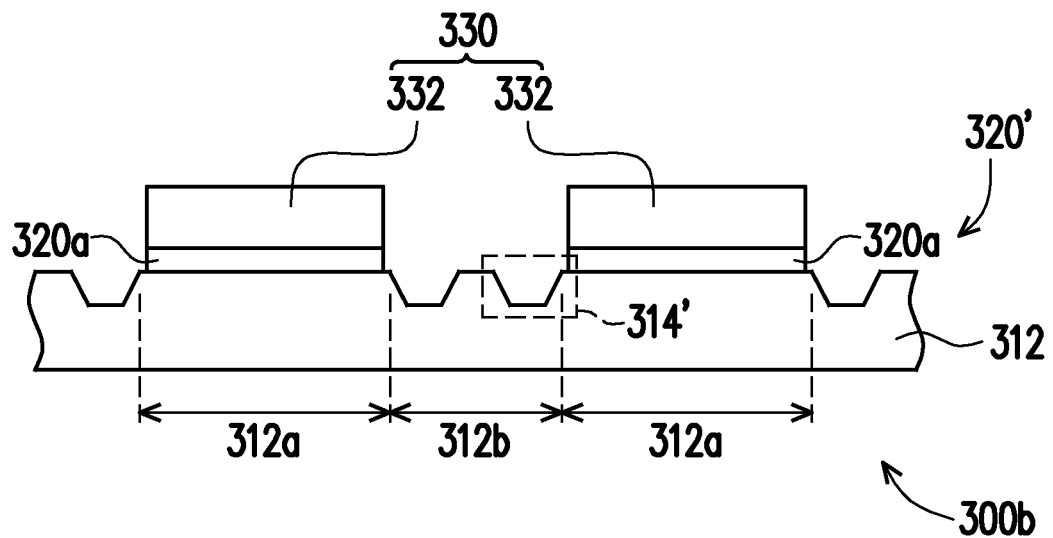
FIG. 6 illustrates a partial cross-sectional view of a light emitting diode wafer according to another embodiment of the invention.

FIG. 6 illustrates a partial cross-sectional view of a light emitting diode wafer according to another embodiment of the invention. A light emitting diode wafer 300b of the present embodiment is similar to the light emitting diode wafer 300a of FIG. 5B, and the difference between the two includes the following. A buffer layer 320' of the light emitting diode wafer 300b of the present embodiment is patterned to form a plurality of buffer portions 320a, which are only disposed in the device-disposed regions 312a. As similar to the embodiment of FIG. 5B, the sub-epitaxial structures 332 are also formed separately in the epitaxial process without additional patterned process (e.g. etching process). Another difference is that the patterned structures 314' are concave.

Figure 7:
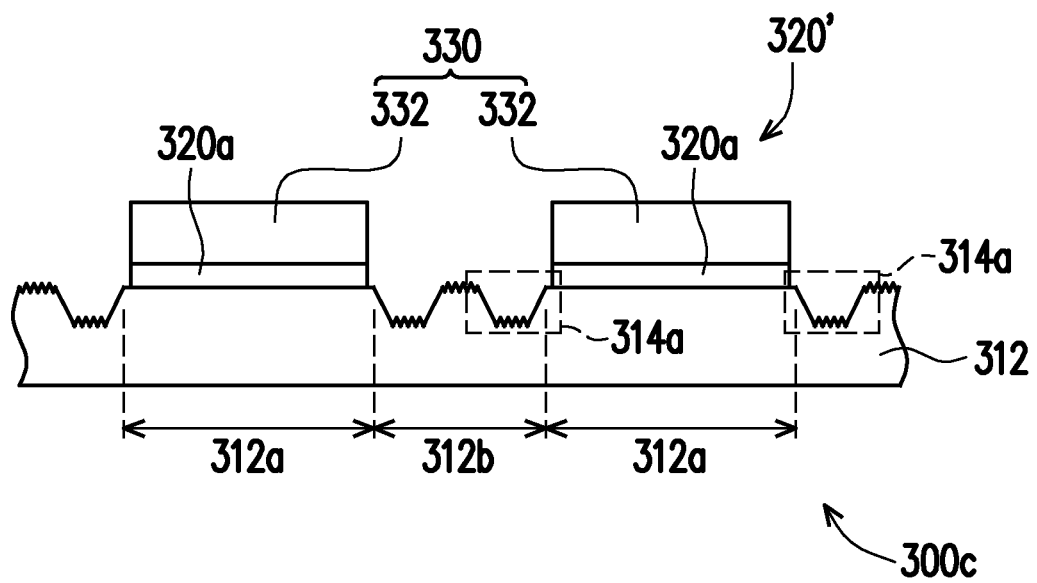
FIG. 7 illustrates a partial cross-sectional view of a light emitting diode wafer according to another embodiment of the invention.

FIG. 7 illustrates a partial cross-sectional view of a light emitting diode wafer according to another embodiment of the invention. With reference to FIG. 7, a light emitting diode wafer 300c of the present embodiment is similar to the light emitting diode wafer 300b of FIG. 6, and the difference between the two includes the following. A roughening process is additionally performed on patterned structures 314a of the light emitting diode wafer 300c in the present embodiment. In this way, it is even harder for the buffer layer 320' and the epitaxial layer 330 to grow on the cutting region 312b, and instead, they are automatically grown into the independently-separated buffer portions 320a and the sub-epitaxial structures 332.

Figure 8:
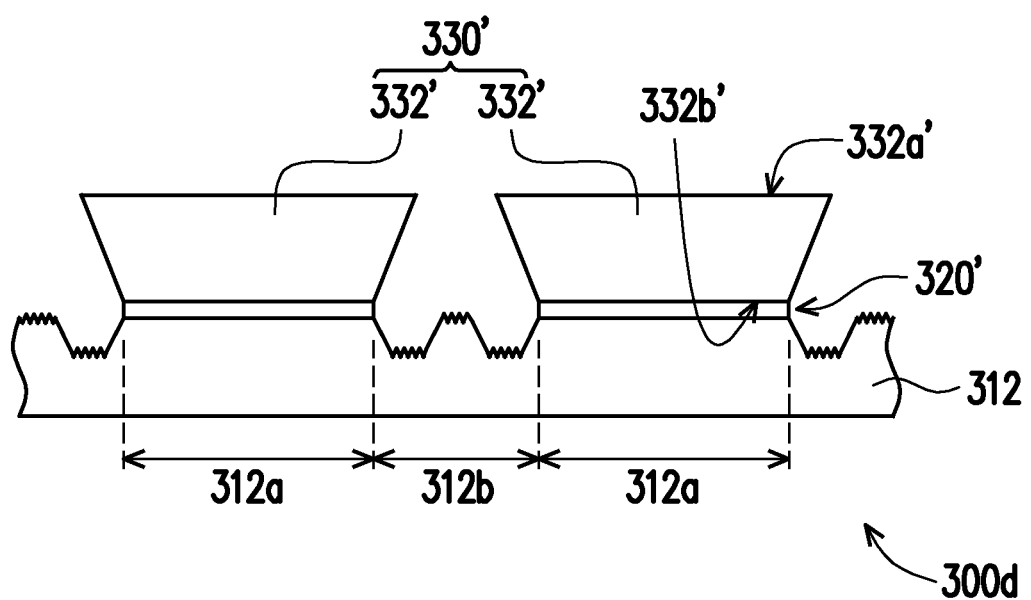
FIG. 8 illustrates a partial cross-sectional view of a light emitting diode wafer according to another embodiment of the invention.

FIG. 8 illustrates a partial cross-sectional view of a light emitting diode wafer according to another embodiment of the invention. With reference to FIG. 8, a light emitting diode wafer 300d of the present embodiment is similar to the light emitting diode wafer 300c of FIG. 7, and the difference between the two includes the following. In the light emitting diode wafer 300d of the present embodiment, the sub-epitaxial structures 332' are an inverted trapezoid, and the sub-epitaxial structure 332' has a bottom surface 332b' in contact with the buffer layer 320' and a top surface 332a' opposite the bottom surface 332b'. An area of the bottom surface 332b' is less than an area of the top surface 332a'. Given that threading dislocation is mainly caused by heterogeneous interface, reducing the contact area between the buffer layer 320' and the main base 312 is necessary. Furthermore, an epitaxial growth rate in vertical and horizontal direction can be adjust to achieve the requirement on grain size for increasing light emitting area. So that, threading dislocation reducing and light emitting efficiency are with proper attention to both.

Figure 9A:
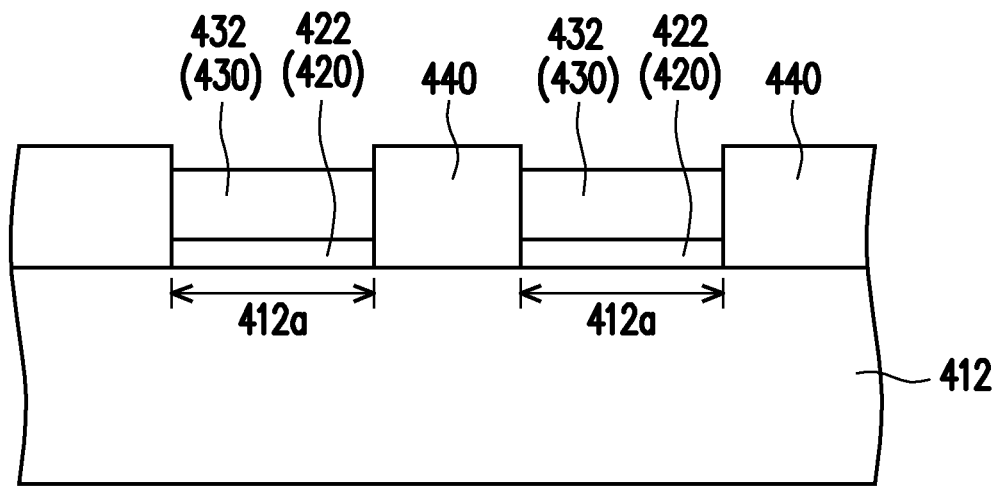
FIG. 9A and FIG. 9B are partial cross-sectional views illustrating a manufacturing method for a light emitting diode wafer according to an embodiment of the invention.
Figure 9B:
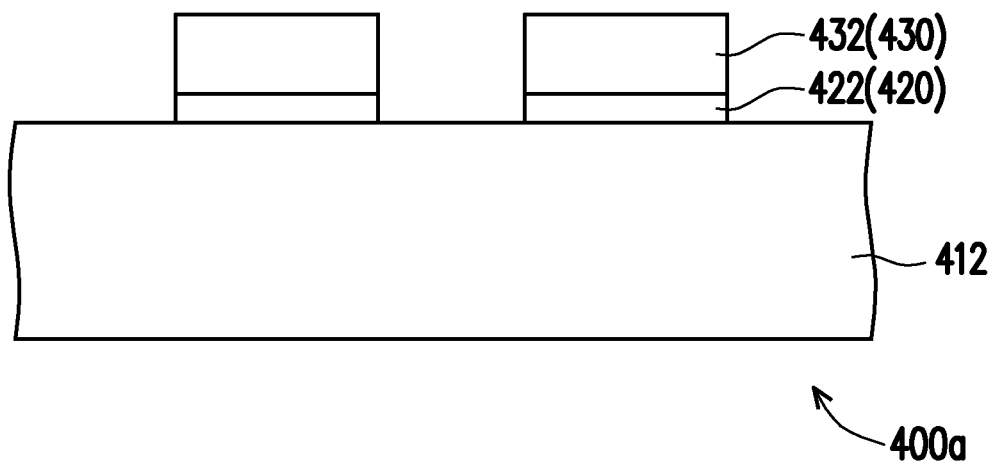

FIG. 9A and FIG. 9B are partial cross-sectional views illustrating a manufacturing method for a light emitting diode wafer according to an embodiment of the invention. First, an blocking patterned layer 440 is disposed on a main base 412 as shown as FIG. 9A, where the blocking patterned layer 440 has a plurality of openings exposing the main base 412 and disposed in device-disposed regions 412a. The blocking patterned layer 440 is composed of materials on which epitaxial material is hard to deposit, such as an organic photoresist material or an inorganic silicon oxide material. Then, an epitaxial process is carried out to form a buffer layer 420 and an epitaxial layer 430. The buffer layer 420 and the epitaxial layer 430 are only formed in the openings of the blocking patterned layer 440, in other words, the buffer layer 420 and the epitaxial layer 430 are disposed on device-disposed regions 412a. Because the blocking patterned layer 440 is disadvantageous for epitaxial growth, the buffer layer 420 will form a plurality of independently-separated buffer portions 422 automatically, and the epitaxial layer 432 will form a plurality of independently-separated sub-epitaxial structures 432 automatically in the epitaxial process. Afterwards, with reference to FIG. 9B, the blocking patterned layer 440 is removed so the sub-epitaxial structures 432 can be obtained without going through definition by cutting or etching process. Similarly, when the light emitting diode wafer 400a is to be cut into a plurality of light emitting diode chips, it is only required to cut the main base 412. In this way, the side surface of the sub-epitaxial structure 432 already independently-separated can be saved from damages during the manufacturing process so the light emitting diode chips will have small quality of defect and light emitting efficiency of the light emitting diode chips will be improved. In particular, for a micro light emitting diode chip with small dimension (e.g., a light emitting diode chip with length less than 50 um or with a thickness of the sub-epitaxial structure less than 6 um), the side surface defect issue usually need to consider more and become more important to light emitting efficiency. By formed the epitaxial structures separated each other automatically would reduce cutting defect.

In summary, in the design of the patterned substrate and the light emitting diode wafer according to the invention, the patterned structures are integratedly formed with the main base, and are separated from each other and are distributed in the cutting region only Later, in the epitaxial process, the patterned structures located in the cutting region can effectively reduce compressive stress and threading dislocation in the epitaxial layer in the device-disposed region so as to improve epitaxial quality. Furthermore, in the design of the patterned substrate according to the invention, the independently-separated sub-epitaxial structures can be automatically formed in the epitaxial process so as to solve the issue regarding poor light emitting efficiency caused by the subsequent cutting process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterned substrate, comprising:
   a main base, having at least one device-disposed region and a cutting region surrounding the device-disposed region; and
   a plurality of patterned structures, integrally formed with the main base, and only distributed in the cutting region of the main base, wherein the patterned structures are separated from each other;
   wherein a surface roughness of the cutting region is greater than a surface roughness of the device-disposed region.

2. The patterned substrate as recited in claim 1, wherein the patterned structures protrude from the main base, and a shape of the patterned structures comprises a pyramid, a cone, a ball or a trapezoid.

3. The patterned substrate as recited in claim 1, wherein the patterned structures are embedded in the main base, and a shape of the patterned structures comprises a concave-pyramid, a concave-cone, a concave-ball or a concave-trapezoid.

4. The patterned substrate as recited in claim 1, wherein a width of the device-disposed region is between 1 μm and 15 μm.

5. The patterned substrate as recited in claim 4, wherein the width of the device-disposed region is defined as a distance between two patterned structures respectively located at opposite sides of the device-disposed region and adjacent to the device-disposed region.

6. The patterned substrate as recited in claim 1, wherein a ratio of a width to a height of each of the patterned structures is between 0.8 and 1.5.

7. The patterned substrate as recited in claim 1, wherein each of the patterned structures has a roughen surface.

8. A light emitting diode wafer, comprising:
a patterned substrate, the patterned substrate comprising:
- a main base, having a plurality of device-disposed regions and a cutting region surrounding the device-disposed regions; and
- a plurality of patterned structures, integrally formed with the main base, and only distributed in the cutting region of the main base, wherein the patterned structures are separated from each other; and an epitaxial layer, disposed on the patterned substrate, wherein the patterned structures are located between the main base and the epitaxial layer;

wherein a surface roughness of the cutting region is greater than a surface roughness of the device-disposed region.

9. The light emitting diode wafer as recited in claim 8, wherein the patterned structures protrude from the main base and a shape of the patterned structures comprises a pyramid, a cone, a ball or a trapezoid.

10. The light emitting diode wafer as recited in claim 8, wherein the patterned structures are embedded in the main base, and a shape of the patterned structures comprises a concave-pyramid, a concave-cone, a concave-ball or a concave-trapezoid.

11. The light emitting diode wafer as recited in claim 8, wherein a width of each of the device-disposed regions is between 1 μm and 15 μm, and a ratio of a width to a height of each of the patterned structures is between 0.8 and 1.5.

12. The light emitting diode wafer as recited in claim 8, wherein each of the patterned structures has a roughen surface.

13. The light emitting diode wafer as recited in claim 8, wherein the epitaxial layer has a plurality of sub-epitaxial structures, and the sub-epitaxial structures are separated from each other and correspondingly located on the device-disposed regions.

14. The light emitting diode wafer as recited in claim 13, wherein a ratio of a width to a height of each of the patterned structures is between 0.2 and 1.

15. The light emitting diode wafer as recited in claim 13, further comprising:
- a buffer layer, located between the patterned substrate and the epitaxial layer, wherein the buffer layer has a plurality of buffer portions separated from each other, the buffer portions are correspondingly located on the device-disposed regions, and the sub-epitaxial structures are respectively formed on the buffer portions.

16. The light emitting diode wafer as recited in claim 15, wherein each of the buffer portions has a bottom surface in contact with the main base and a top surface in contact with each of the sub-epitaxial structures, and an area of the bottom surface is less than an area of the top surface.

* * * * *